United States Patent
Lorenzzi et al.

(10) Patent No.: US 10,843,962 B2
(45) Date of Patent: *Nov. 24, 2020

(54) SUBSTRATE PROVIDED WITH A STACK HAVING THERMAL PROPERTIES

(71) Applicant: SAINT-GOBAIN GLASS FRANCE, Courbevoie (FR)

(72) Inventors: Jean Carlos Lorenzzi, Paris (FR); Thierry Kauffmann, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 143 days.

This patent is subject to a terminal disclaimer.

(21) Appl. No.: 15/742,310

(22) PCT Filed: Jun. 30, 2016

(86) PCT No.: PCT/FR2016/051645
§ 371 (c)(1),
(2) Date: Jan. 5, 2018

(87) PCT Pub. No.: WO2017/006027
PCT Pub. Date: Jan. 12, 2017

(65) Prior Publication Data
US 2018/0194676 A1 Jul. 12, 2018

(30) Foreign Application Priority Data
Jul. 8, 2015 (FR) ..................... 15 56476

(51) Int. Cl.
*C03C 17/36* (2006.01)
*G02B 5/28* (2006.01)
(Continued)

(52) U.S. Cl.
CPC .... *C03C 17/3639* (2013.01); *B32B 17/10036* (2013.01); *B32B 17/10045* (2013.01);
(Continued)

(58) Field of Classification Search
CPC ......... G02B 5/208; G02B 5/281–5/282; G02B 5/285; B32B 7/00–7/14;
(Continued)

(56) References Cited

U.S. PATENT DOCUMENTS 6,068,914 A * 5/2000 Boire ................ B32B 17/10018
428/216
2013/0057951 A1  3/2013 Hevesi et al.
(Continued)

FOREIGN PATENT DOCUMENTS

CN        202175621 U  *  3/2012  ......... C03C 17/3626
WO   WO 2013/104438 A1   7/2013
(Continued)

OTHER PUBLICATIONS

Machine translation of CN202175621. Retrieved Jan. 25, 2019.*
(Continued)

*Primary Examiner* — Prashant J Khatri
(74) *Attorney, Agent, or Firm* — Pillsbury Winthrop Shaw Pittman LLP

(57) ABSTRACT

A material includes a transparent substrate coated with a stack of thin layers successively including, starting from the substrate, an alternation of three silver-based functional metallic layers and of four dielectric coatings, so that each functional metallic layer is positioned between two dielectric coatings. The thicknesses of the three functional layers and the thicknesses of the dielectric coatings are selected in order to give the materials solar factor values of less than 20% for a light transmission of the order of 40%.

19 Claims, 1 Drawing Sheet

(51) Int. Cl.
*B32B 17/10* (2006.01)
*C23C 14/00* (2006.01)
*C23C 14/06* (2006.01)
*C23C 14/08* (2006.01)
*C23C 14/18* (2006.01)
*C23C 14/34* (2006.01)
*G02B 5/20* (2006.01)

(52) U.S. Cl.
CPC .. *B32B 17/10055* (2013.01); *B32B 17/10229* (2013.01); *C03C 17/36* (2013.01); *C03C 17/366* (2013.01); *C03C 17/3613* (2013.01); *C03C 17/3644* (2013.01); *C03C 17/3652* (2013.01); *C03C 17/3681* (2013.01); *C23C 14/0036* (2013.01); *C23C 14/0652* (2013.01); *C23C 14/083* (2013.01); *C23C 14/086* (2013.01); *C23C 14/185* (2013.01); *C23C 14/3464* (2013.01); *G02B 5/281* (2013.01); *G02B 5/282* (2013.01); *G02B 5/285* (2013.01); *C03C 2218/156* (2013.01); *G02B 5/208* (2013.01)

(58) Field of Classification Search
CPC ......... B32B 17/00–17/44; C03C 17/00–17/44; C23C 14/00–14/5893
See application file for complete search history.

(56) References Cited

U.S. PATENT DOCUMENTS

2014/0272395 A1* 9/2014 Ding .................. G02F 1/091
428/336
2015/0004383 A1* 1/2015 Sandre-Chardonnal .................
C03C 17/36
428/213

FOREIGN PATENT DOCUMENTS

| WO | WO-2013107983 A1 * | 7/2013 | ............. C03C 17/36 |
| WO | WO 2014/177798 A1 | 11/2014 | |
| WO | WO 2014/191485 A2 | 12/2014 | |

OTHER PUBLICATIONS

International Search Report as issued in International Patent Application No. PCT/FR2016/051645, dated Oct. 10, 2016.
Search Report as issued in Russian Patent Application No. 2018103405, dated Oct. 22, 2019.

* cited by examiner

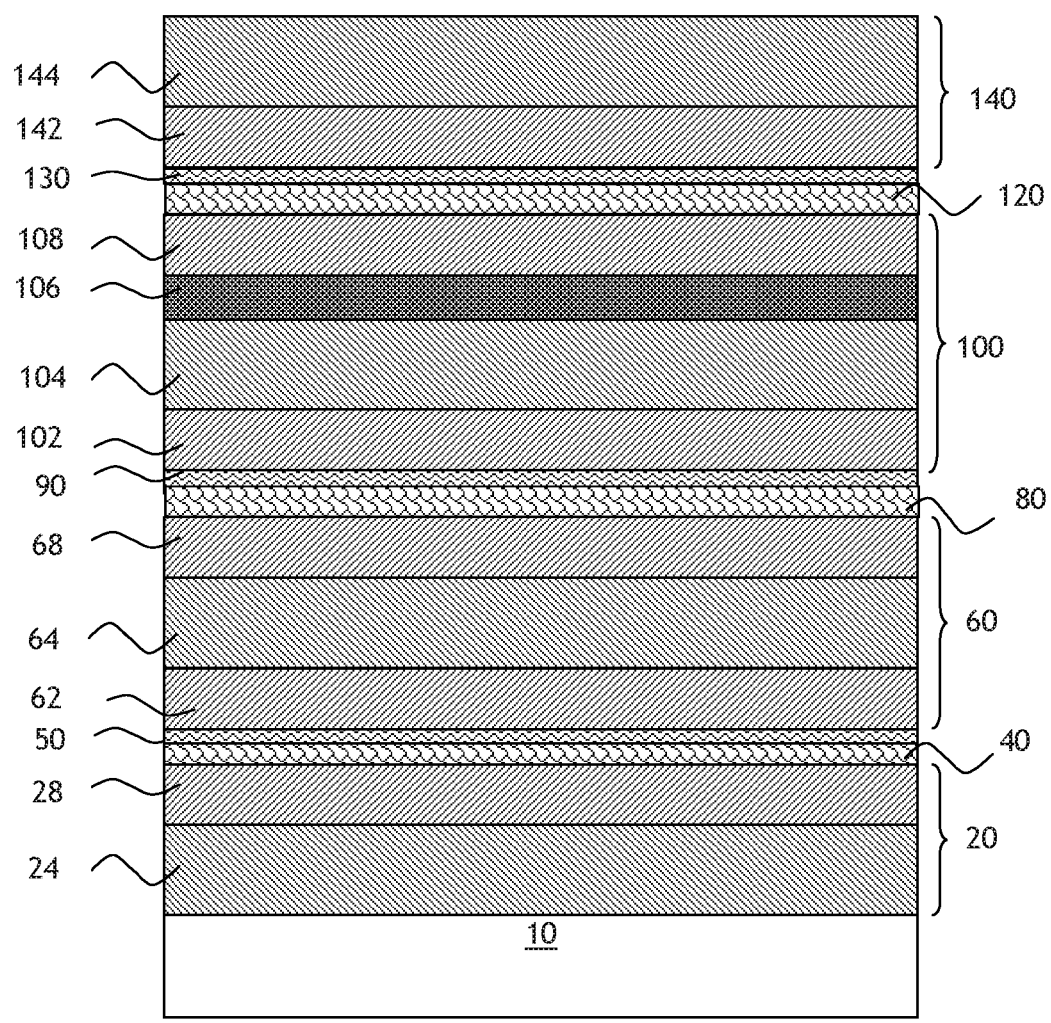

SUBSTRATE PROVIDED WITH A STACK HAVING THERMAL PROPERTIES

CROSS-REFERENCE TO RELATED APPLICATIONS

This application is the U.S. National Stage of PCT/FR2016/051645, filed Jun. 30, 2016, which in turn claims priority to French patent application number 1556476 filed Jul. 8, 2015. The content of these applications are incorporated herein by reference in their entireties.

The invention relates to a material, such as a glazing, comprising a transparent substrate coated with a stack of thin layers comprising several functional layers that can influence solar radiation and/or infrared radiation. The invention also relates to glazings comprising these materials and also to the use of such materials for manufacturing thermal insulation and/or solar protection glazings.

These glazings may be intended to equip both buildings and vehicles, for the purpose in particular of reducing the air-conditioning load and/or of preventing excessive overheating, which glazings are referred to as "solar control" glazings, and/or to reduce the amount of energy dissipated to the outside, which glazings are referred to as "low-emissivity" glazings, driven by the ever-increasing size of glazed surfaces in buildings and vehicle passenger compartments.

Depending on the climates of the countries where these glazings are installed, the desired performance in terms of light transmission and solar factor may vary within a certain range. The light transmission must be low enough to eliminate glare and high enough so that the reduction in the amount of light penetrating inside the space delimited by said glazing does not make it necessary to use artificial light. For example, in countries with high levels of sunshine, there is a great demand for glazings having a light transmission of the order of 40% and sufficiently low solar factor values.

Glazings comprising transparent substrates coated with a stack of thin layers comprising three functional metallic layers, each positioned between two dielectric coatings, have been proposed in order to improve the solar protection while retaining a sufficient light transmission. These stacks are generally obtained by a series of depositions carried out by sputtering, optionally magnetron sputtering. These glazings are described as selective since they make it possible:
to reduce the amount of solar energy penetrating inside buildings by having a low solar factor (SF or g),
to guarantee a sufficient light transmission,
to have a low emissivity in order to reduce the heat loss by long-wavelength infrared radiation.
According to the invention:
solar factor "g" is understood to mean the ratio, as a percentage, of the total energy entering the space through the glazing to the incident solar energy,
selectivity "s" is understood to mean the ratio of the light transmission to the solar factor $T_L/g$.

The most selective materials from the prior art based on a stack comprising three functional layers make it possible to obtain solar factor values that may range up to 22%. However, this value is still too high for certain countries, where solar factor values of less than 20% are desired.

The materials currently on the market do not make it possible to combine a low solar factor, in particular of less than 20%, for a light transmission of around 40%, a good selectivity (>2.0) and also a low reflection on the external side.

The objective of the invention is therefore to develop a material having exceptional solar control properties and in particular solar factor values of less than 20% for a light transmission of the order of 40%. According to the invention, it is therefore sought to minimize the solar factor and to increase the selectivity, while keeping a light transmission suitable for allowing good insulation and good vision.

The complexity of the stacks comprising three silver-based functional layers makes it difficult to improve the thermal performance and reflection properties without adversely affecting the other properties of the stack.

The Applicant has surprisingly discovered that by optimizing the thicknesses of the three functional layers and the thicknesses of the dielectric coatings, a material capable of exhibiting the desired properties is obtained.

The solution of the invention represents an excellent compromise between the optical performance, thermal performance, transparency and esthetic appearance.

One subject of the invention is a material comprising a transparent substrate coated with a stack of thin layers successively comprising, starting from the substrate, an alternation of three silver-based functional metallic layers referred to, starting from the substrate, as first, second and third functional layers and of four dielectric coatings, referred to, starting from the substrate, as M1, M2, M3 and M4, each dielectric coating comprising at least one dielectric layer, so that each functional metallic layer is positioned between two dielectric coatings, characterized in that:
the thickness of the first functional layer is less than the thickness of the second functional layer,
the thickness of the first functional layer is less than the thickness of the third functional layer,
the ratio of the thickness of the third functional metallic layer to the thickness of the second functional layer is between 0.90 and 1.10, including these values, preferably between 0.95 and 1.05,
the dielectric coatings M1, M2, M3 and M4 each have an optical thickness Eo1, Eo2, Eo3 and Eo4 satisfying the following equation: Eo4<Eo1<Eo2<Eo3,
the optical thickness Eo1 of the dielectric coating M1 is greater than 80 nm,
the optical thickness Eo2 of the dielectric coating M2 is greater than 100 nm,
the optical thickness Eo3 of the dielectric coating M3 is greater than 120 nm,
the optical thickness Eo4 of the dielectric coating M4 is greater than 60 nm.

The invention also relates to:
the process for obtaining a material according to the invention,
the glazing comprising at least one material according to the invention,
the use of a glazing according to the invention as solar-control glazing for buildings or vehicles,
a building or vehicle comprising a glazing according to the invention.

By adjusting the thicknesses of the functional layers and of the dielectric coatings, the transparency of the glazing may be controlled so as to obtain light transmission $T_L$ values of the order of 40%, which range is very particularly suitable for glazings intended to be used in high-sunshine regions. But the major advantage of the invention is that obtaining the satisfactory visual appearance with in particular specific colors in external reflection and sufficiently low external reflection values does not take place to the detriment of the solar protection performance. The excellent energy performance is maintained without requiring substantial modifications of the other parameters of the stack such as the nature, the thickness and the sequence of the layers forming it.

The preferred features that appear in the remainder of the description are applicable both to the process according to the invention and, where appropriate, to the products, that is to say to the materials or to the glazings comprising the material.

All the luminous characteristics presented in the description are obtained according to the principles and methods described in European standard EN 410 relating to the determination of luminous and solar characteristics of glazings used in glass for building.

Conventionally, the refractive indices are measured at a wavelength of 550 nm. The light transmission $T_L$ and light reflection $R_L$ factors are measured under the illuminant D65 with a field of vision of 2°.

Unless otherwise indicated, all the values and ranges of values of the optical and thermal features are given for a double glazing consisting of a 6 mm standard soda-lime glass substrate bearing the stack of thin layers, a 16 mm interlayer space filled with argon in a proportion of 90% and air in a proportion of 10% and another soda-lime glass substrate that is not coated and that has a thickness of 4 mm. The coated substrate is placed so that the stack of thin layers is on face 2 of the glazing. The external reflection Rext. is observed from the side of the substrate comprising the stack, whilst the reflection observed from the side of the substrate not comprising the stack is designated as the internal reflection. The light transmission ($T_L$) of standard soda-lime glass substrates, with no stack, is greater than 89%, preferably 90%.

Unless otherwise mentioned, the thicknesses stated in the present document with no other specifications are physical, real or geometric thicknesses referred to as Ep and are expressed in nanometers (and not optical thicknesses). The optical thickness Eo is defined as the physical thickness of the layer in question multiplied by its refractive index at the wavelength of 550 nm: Eo=n*Ep. Since the refractive index is a dimensionless value, the unit of the optical thickness can be considered to be the unit selected for the physical thickness.

If a dielectric coating is composed of several dielectric layers, the optical thickness of the dielectric coating corresponds to the sum of the optical thicknesses of the various dielectric layers forming the dielectric coating.

Throughout the description, the substrate according to the invention is considered to be positioned horizontally. The stack of thin layers is deposited on top of the substrate. The meaning of the expressions "on top of" and "underneath" and "lower" and "upper" should be considered relative to this orientation. Unless specifically stipulated, the expressions "on top of" and "underneath" do not necessarily mean that two layers and/or coatings are positioned in contact with one another. When it is specified that a layer is deposited "in contact" with another layer or with a coating, this means that there cannot be one (or more) layer(s) inserted between these two layers (or layer and coating).

Within the meaning of the present invention, the labels "first", "second", "third" and "fourth" for the functional layers or the dielectric coatings are defined starting from the substrate bearing the stack and with reference to the layers or coatings having the same function. For example, the functional layer closest to the substrate is the first functional layer, the next one moving away from the substrate is the second functional layer, etc.

Preferably, the stack is deposited by magnetron sputtering. According to this advantageous embodiment, all the layers of the stack are deposited by magnetron sputtering.

The invention also relates to the process for obtaining a material according to the invention, wherein the layers of the stack are deposited by magnetron sputtering.

The silver-based functional metallic layers comprise at least 95.0%, preferably at least 96.5% and better still at least 98.0% by weight of silver relative to the weight of the functional layer. Preferably, the silver-based functional metallic layer comprises less than 1.0% by weight of metals other than silver relative to the weight of the silver-based functional layer.

According to advantageous embodiments of the invention, the functional metallic layers satisfy one or more of the following conditions:
  the three functional metallic layers correspond to the first, the second and the third functional metallic layer defined starting from the substrate,
  the ratio of the thickness of the third functional metallic layer to the thickness of the second functional layer is between 0.90 and 1.10, including these values, preferably between 0.95 and 1.05, and/or
  the thickness of the first functional metallic layer is, in order of increasing preference, between 6 and 12 nm, between 7 and 11 nm, between 8 and 10 nm, and/or
  the thickness of the second functional layer is greater than 15 nm, and/or
  the thickness of the second functional metallic layer is, in order of increasing preference, between 15 and 20 nm, between 16 and 18 nm, and/or
  the thickness of the third functional metallic layer is, in order of increasing preference, between 15 and 20 nm, between 16 and 18 nm.

These thickness ranges for the functional metallic layers are the ranges for which the best results are obtained for a light transmission in double glazing of around 40%, and low light reflection and solar factor. Thus a high selectivity, and neutral colors in reflection from the outside, are obtained.

The stack may also comprise at least one blocking layer located in contact with a functional layer.

The role of the blocking layers is conventionally to protect the functional layers from a possible degradation during the deposition of the upper dielectric coating and during an optional high-temperature heat treatment of the annealing, bending and/or tempering type.

The blocking layers are selected from metallic layers based on a metal or on a metal alloy, metal nitride layers, metal oxide layers and metal oxynitride layers of one or more elements selected from titanium, nickel, chromium and niobium, such as Ti, TiN, TiOx, Nb, NbN, Ni, NiN, Cr, CrN, NiCr or NiCrN. When these blocking layers are deposited in metallic, nitride or oxynitride form, these layers may undergo a partial or complete oxidation depending on their thickness and the nature of the layers that surround them, for example, at the time of the deposition of the next layer or by oxidation in contact with the underlying layer.

According to advantageous embodiments of the invention, the blocking layer(s) satisfy one or more of the following conditions:
  each functional metallic layer is in contact with at least one blocking layer selected from a blocking underlayer and a blocking overlayer, and/or
  each functional metallic layer is in contact with a blocking underlayer and a blocking overlayer, and/or
  the thickness of each blocking layer is at least 0.1 nm, preferably between 0.5 and 2.0 nm, and/or the total thickness of all the blocking layers in contact with the functional layers is between 3 and 8 nm, including these values, preferably between 4 and 7 nm, or even 5 and 6 nm.

According to advantageous embodiments of the invention, the dielectric coatings satisfy one or more of the following conditions in terms of thicknesses:

the optical thickness of the first dielectric coating M1 is, in order of increasing preference, from 80 to 140 nm, from 90 to 130 nm, from 95 to 125 nm, and/or the physical thickness of the first dielectric coating M1 is, in order of increasing preference, from 30 to 80 nm, from 40 to 70 nm, from 45 to 65 nm, and/or the optical thickness of the second dielectric coating M2 is, in order of increasing preference, from 100 to 170 nm, from 130 to 160 nm, from 140 to 150 nm, and/or the physical thickness of the second dielectric coating M2 is, in order of increasing preference, from 40 to 100 nm, from 50 to 80 nm, from 65 to 75 nm, and/or the optical thickness of the third dielectric coating M3 is, in order of increasing preference, from 120 to 240 nm, from 140 to 220 nm, from 155 to 210 nm, from 180 to 200 nm, and/or the physical thickness of the third dielectric coating M3 is, in order of increasing preference, from 60 to 120 nm, from 80 to 110 nm, from 90 to 100 nm, and/or the optical thickness of the fourth dielectric coating M4 is, in order of increasing preference, from 60 to 120 nm, from 70 to 110 nm, from 80 to 100 nm, and/or the physical thickness of the fourth dielectric coating M4 is, in order of increasing preference, from 20 to 60 nm, from 30 to 55 nm, from 40 to 50 nm.

According to advantageous embodiments of the invention, the dielectric coatings satisfy one or more of the following conditions:

the dielectric coatings comprise at least one dielectric layer based on an oxide or a nitride of one or more elements selected from silicon, titanium, zirconium, aluminum, tin, zinc, and/or at least one dielectric coating comprises at least one dielectric layer having a barrier function, and/or each dielectric coating comprises at least one dielectric layer having a barrier function, and/or the dielectric layers having a barrier function based on silicon and/or aluminum compounds selected from oxides such as $SiO_2$ and $Al_2O_3$, silicon nitrides $Si_3N_4$ and AlN and oxynitrides $SiO_xN_y$ and $AlO_xN_y$, and/or the dielectric layers having a barrier function are based on silicon and/or aluminum compounds optionally comprise at least one other element, such as aluminum, hafnium and zirconium, and/or at least one dielectric coating comprises at least one dielectric layer having a stabilizing function, and/or each dielectric coating comprises at least one dielectric layer having a stabilizing function, and/or the dielectric layers having a stabilizing function are preferably based on an oxide selected from zinc oxide, tin oxide, zirconium oxide or a mixture of at least two thereof, the dielectric layers having a stabilizing function are preferably based on a crystalline oxide, in particular based on zinc oxide, optionally doped with the aid of at least one other element, such as aluminum, and/or each functional layer is on top of a dielectric coating, the upper layer of which is a dielectric layer having a stabilizing function, preferably based on zinc oxide and/or underneath a dielectric coating, the lower layer of which is a dielectric layer having a stabilizing function, preferably based on zinc oxide, at least one dielectric coating located underneath a functional metallic layer comprises at least one dielectric layer having a smoothing function, and/or each dielectric coating located underneath a functional metallic layer comprises at least one dielectric layer having a smoothing function, and/or the dielectric layers having a smoothing function are preferably based on a mixed oxide of at least two metals selected from Sn, Zn, In, Ga, and/or the dielectric layers having a smoothing function are preferably zinc tin mixed oxide layers which are optionally doped.

Preferably, each dielectric coating consists only of one or more dielectric layers. Preferably, there is thus no absorbent layer in the dielectric coatings in order not to reduce the light transmission.

The stacks of the invention may comprise dielectric layers having a barrier function. The term "dielectric layers having a barrier function" is understood to mean a layer made of a material capable of forming a barrier to the diffusion of oxygen and water at high temperature, originating from the ambient atmosphere or from the transparent substrate, toward the functional layer. The constituent materials of the dielectric layer having a barrier function thus must not undergo chemical or structural modification at high temperature which would result in a modification to their optical properties. The layer or layers having a barrier function are preferably also selected from a material capable of forming a barrier to the constituent material of the functional layer. The dielectric layers having a barrier function thus allow the stack to be subjected, without excessively significant optical change, to heat treatments of the annealing, tempering or bending type.

The stacks of the invention may comprise dielectric layers having a stabilizing function. Within the meaning of the invention, "stabilizing" means that the nature of the layer is selected so as to stabilize the interface between the functional layer and this layer. This stabilization results in the reinforcing of the adhesion of the functional layer to the layers which surround it and thus it will oppose the migration of its constituent material.

The dielectric layer(s) having a stabilizing function may be directly in contact with a functional layer or separated by a blocking layer.

Preferably, the final dielectric layer of each dielectric coating located underneath a functional layer is a dielectric layer having a stabilizing function. This is because it is advantageous to have a layer having a stabilizing function, for example, based on zinc oxide underneath a functional layer, as it facilitates the adhesion and the crystallization of the silver-based functional layer and increases its quality and its stability at high temperature.

It is also advantageous to have a layer having a stabilizing function, for example, based on zinc oxide on top of a functional layer, in order to increase the adhesion thereof and to optimally oppose the diffusion from the side of the stack opposite the substrate.

The dielectric layer(s) having a stabilizing function may thus be on top of and/or underneath at least one functional layer or each functional layer, either directly in contact therewith or separated by a blocking layer.

Advantageously, each dielectric layer having a barrier function is separated from a functional layer by at least one dielectric layer having a stabilizing function.

This dielectric layer having a stabilizing function may have a thickness of at least 4 nm, in particular a thickness of between 4 and 10 nm and better still from 8 to 10 nm.

The stack of thin layers may optionally comprise a smoothing layer. The term "smoothing layer" is understood to mean a layer having the role of promoting the growth of the stabilizing layer in a preferential crystallographic orientation, which promotes the crystallization of the silver layer via epitaxial phenomena. The smoothing layer is located underneath and preferably in contact with a stabilizing layer.

The smoothing layer based on a mixed oxide may be described as "noncrystalline" in the sense that it may be completely amorphous or partially amorphous and thus partially crystalline, but it cannot be completely crystalline over its entire thickness. It cannot be of metallic nature since it is based on a mixed oxide (a mixed oxide is an oxide of at least two elements).

The stack of thin layers may optionally comprise a protective layer. The protective layer is preferably the final layer of the stack, that is to say the layer furthest from the substrate coated with the stack. These upper protective layers are considered to be included in the fourth dielectric coating. These layers in general have a thickness of between 2 and 10 nm, preferably 2 and 5 nm. This protective layer may be selected from a layer of titanium, zirconium, hafnium, zinc and/or tin, this or these metals being in metallic, oxide or nitride form.

The protective layer may for example be selected from a titanium oxide layer, a zinc tin oxide layer or a titanium zirconium oxide layer.

One particularly advantageous embodiment relates to a substrate coated with a stack, defined starting from the transparent substrate, comprising:
 a first dielectric coating comprising at least one dielectric layer having a barrier function and one dielectric layer having a stabilizing function,
 optionally a blocking layer,
 a first functional layer,
 optionally a blocking layer,
 a second dielectric coating comprising at least one lower dielectric layer having a stabilizing function, one dielectric layer having a barrier function and one upper dielectric layer having a stabilizing function,
 optionally a blocking layer,
 a second functional layer,
 optionally a blocking layer,
 a third dielectric coating comprising at least one lower dielectric layer having a stabilizing function, one dielectric layer having a barrier function and one upper dielectric layer having a stabilizing function,
 optionally a blocking layer,
 a third functional layer,
 optionally a blocking layer,
 a fourth dielectric coating comprising at least one dielectric layer having a stabilizing function, one dielectric layer having a barrier function and optionally one protective layer.

The transparent substrates according to the invention are preferably made of an inorganic rigid material, such as glass, or an organic material based on polymers (or made of polymer).

The organic transparent substrates according to the invention may also be made of rigid or flexible polymers. Examples of polymers that are suitable according to the invention include, in particular:

polyethylene,
polyesters such as polyethylene terephthalate (PET), polybutylene terephthalate (PBT), polyethylene naphthalate (PEN);
polyacrylates such as polymethyl methacrylate (PMMA);
polycarbonates;
polyurethanes;
polyamides;
polyimides;
fluoropolymers, for instance fluoroesters such as ethylene tetrafluoroethylene (ETFE), polyvinylidene fluoride (PVDF), polychlorotrifluoroethylene (PCTFE), ethylene chlorotrifluoroethylene (ECTFE), fluorinated ethylene-propylene (FEP) copolymers;
photocrosslinkable and/or photopolymerizable resins, such as thiolene, polyurethane, urethane-acrylate and polyester-acrylate resins; and
polythiourethanes.

The substrate is preferably a sheet of glass or of glass-ceramic.

The substrate is preferably transparent, colorless (it is then a clear or extra-clear glass) or colored, for example colored blue, grey or bronze. The glass is preferably of soda-lime-silica type, but it may also be made of glass of borosilicate or alumino-borosilicate type.

The substrate advantageously has at least one dimension greater than or equal to 1 m, or even 2 m and even 3 m. The thickness of the substrate generally varies between 0.5 mm and 19 mm, preferably between 0.7 and 9 mm, in particular between 2 and 8 mm, or even between 4 and 6 mm. The substrate may be flat or curved, or even flexible.

The material, that is to say the substrate coated with the stack, may undergo a high-temperature heat treatment such as an annealing, for example a flash annealing such as a laser or flame annealing, a tempering and/or a bending. The temperature of the heat treatment is greater than 400° C., preferably greater than 450° C., and better still greater than 500° C. The substrate coated with the stack may therefore be curved and/or tempered.

The invention also relates to a glazing comprising a material according to the invention. Conventionally, the faces of a glazing are denoted starting from the outside of the building and by numbering the faces of the substrates from the outside towards the inside of the passenger compartment or room that it equips. This means that the incident solar light passes through the faces in the increasing order of their number.

The stack is preferably positioned in the glazing so that the incident light coming from outside passes through the first dielectric coating before passing through the first functional metallic layer. The stack is not deposited on the face of the substrate that defines the external wall of the glazing but on the inner face of this substrate. The stack is therefore advantageously positioned on face 2, face 1 of the glazing being the outermost face of the glazing, as is customary.

The material may be intended for applications that require the substrate coated with the stack to have undergone a heat treatment at a high temperature such as a tempering, an annealing or a bending.

The glazing of the invention may be in the form of monolithic, laminated or multiple glazing, in particular double glazing or triple glazing.

In the case of a monolithic or multiple glazing, the stack is preferably deposited on face 2, that is to say that it is on the substrate that defines the external wall of the glazing and more specifically on the inner face of this substrate.

A monolithic glazing comprises 2 faces; face 1 is on the outside of the building and therefore constitutes the external wall of the glazing, face 2 is on the inside of the building and therefore constitutes the internal wall of the glazing.

A multiple glazing comprises at least two substrates kept at a distance so as to delimit a cavity filled by an insulating gas. The materials according to the invention are very particularly suitable when they are used in double glazings with enhanced thermal insulation (ETI).

A double glazing comprises 4 faces; face 1 is outside of the building and therefore constitutes the external wall of the glazing, face 4 is inside the building and therefore constitutes the internal wall of the glazing, faces 2 and 3 being on the inside of the double glazing.

In the same way, a triple glazing comprises 6 faces; face 1 is outside of the building (external wall of the glazing), face 6 is inside the building (internal wall of the glazing) and faces 2 to 5 are on the inside of the triple glazing.

A laminated glazing comprises at least one structure of first substrate/sheet(s)/second substrate type. The stack of thin layers is positioned on at least one of the faces of one of the substrates. The stack may be on the face of the second substrate not in contact with the, preferably polymer, sheet. This embodiment is advantageous when the laminated glazing is assembled as double glazing with a third substrate.

The glazing according to the invention, used as monolithic glazing or in a multiple glazing of double glazing type, has neutral, pleasant and subdued colors in external reflection, within the range of blues or blue-greens (values for dominant wavelength of the order of 470 to 500 nanometers). Furthermore, this visual appearance remains virtually unchanged irrespective of the angle of incidence with which the glazing is observed (normal incidence and under an angle). This means that an observer does not have the impression of a significant lack of uniformity in color or in appearance.

The term "color in the blue-green" should be understood as meaning, within the meaning of the present invention, that, in the L*a*b*color measurement system, a*is between −10.0 and 0.0, preferably between −5.0 and 0.0, and b*is between −10.0 and 0.0, preferably between −5.0 and 0.0.

The glazing of the invention has colors in transmission in the L*a*b*color measurement system:
   a*is between −6.0 and 0.0, preferably between −5.0 and −1.0,
   b*is between −6.0 and 3.0, preferably between −5.0 and 0.0.

The glazing of the invention has colors in reflection on the external side in the L*a*b*color measurement system:
   a*between −5.0 and 0.0, preferably between −4.0 and −1.0 and/or
   b*is between −10.0 and 0.0, preferably between −9.0 and −5.0.

According to advantageous embodiments, the glazing of the invention in the form of a double glazing comprising the stack positioned on face 2 makes it possible to achieve, in particular, the following performances:
   a solar factor less than or equal to 20%, or even less than or equal to 19%, and/or
   a light transmission of less than 50%, preferably between 30% and 50%, or even between 35% and 45%, and/or
   a high selectivity, in order of increasing preference, of at least 1.8, of at least 1.9, of at least 2.0, of at least 2.1 and/or
   a low emissivity, in particular of less than 1%, and/or
   a light reflection on the external side of less than or equal to 25%, preferably less than or equal to 22.5%, or even less than or equal to 20%, and/or
   neutral colors in external reflection.

The advantageous details and features of the invention will emerge from the following nonlimiting examples, illustrated with the aid of the appended FIGURE.

The proportions between the various components are not respected in order to make the FIGURES easier to read.

FIG. 1 illustrates a structure of a stack having three functional metallic layers 40, 80, 120, this structure being deposited on a transparent glass substrate 10. Each functional layer 40, 80, 120 is positioned between two dielectric coatings 20, 60, 100, 140 such that:
   the first functional layer 40, starting from the substrate, is positioned between the dielectric coatings 20, 60,
   the second functional layer 80 is positioned between the dielectric coatings 60, 100 and
   the third functional layer 120 is positioned between the dielectric coatings 100, 140.

These dielectric coatings 20, 60, 100, 140 each comprise at least one dielectric layer 24, 28; 62, 64, 68; 102, 104, 106, 108; 142, 144.

The stack may also comprise:
   blocking underlayers 30, 70, and 110 (not represented), located in contact with a functional layer,
   blocking overlayers 50, 90 and 130 located in contact with a functional layer,
   a protective layer 160 (not represented).

EXAMPLES

I. Preparation of the Substrates: Stacks, Deposition Conditions and Heat Treatments Stacks, defined below, of thin layers are deposited on substrates made of clear soda-lime glass with a thickness of 6 mm.

In the examples of the invention:
   the functional layers are layers of silver (Ag),
   the blocking layers are metallic layers made of nickel-chromium alloy (NiCr),
   the barrier layers are based on silica nitride, doped with aluminum ($Si_3N_4$:Al),
   the stabilizing layers are made of zinc oxide (ZnO),
   the smoothing layers are based on zinc tin mixed oxide (SnZnOx),
   the protective layers are made of titanium zirconium oxide (TiZrOx).

The conditions for deposition of the layers, which were deposited by sputtering (magnetron sputtering), are summarized in table 1.

TABLE 1

|  | Target employed | Deposition pressure | Gas | n 550 nm |
|---|---|---|---|---|
| $Si_3N_4$ | Si:Al at 92:8% by weight | $3.2 \times 10^{-3}$ mbar | Ar/(Ar + N2) at 55% | 2.03 |
| ZnO | Zn:Al at 98:2% by weight | $1.8 \times 10^{-3}$ mbar | Ar/(Ar + O2) at 63% | 1.95 |
| SnZnOx | Sn:Zn (60:40% by weight) | $1.5 \times 10^{-3}$ mbar | Ar 39%-$O_2$ 61% | 2.09 |
| TiZrO | TiZrOx | 2-4 $\times 10^{-3}$ mbar | Ar 90%-$O_2$ 10% | 2.32 |

TABLE 1-continued

| | Target employed | Deposition pressure | Gas | n 550 nm |
|---|---|---|---|---|
| NiCr | Ni (80 at. %):Cr (20 at. %) | 2-3 × 10$^{-3}$ mbar | Ar at 100% | — |
| Ag | Ag | 3 × 10$^{-3}$ mbar | Ar at 100% | — | at. = atomic

Table 2 lists the materials and the physical thicknesses in nanometers (unless otherwise indicated) for each layer or coating that forms the stacks as a function of their position with respect to the substrate bearing the stack (final line at the bottom of the table). The "Ref." numbers correspond to the references from FIG. 1.

Each dielectric coating 20, 60, 100, 140 comprises a dielectric layer having a barrier function 24, 64, 104, 144, based on silica nitride, doped with aluminum, referred to here as $Si_3N_4$.

The dielectric coating 100 also comprises a smoothing layer based on zinc tin mixed oxide 106.

TABLE 2

| | Ref. | Inv. 1 | Inv. 2 | Inv. 3 | Inv. 4 | Comp. 1 | Comp. 2 |
|---|---|---|---|---|---|---|---|
| Dielectric coating M4 | 140 | 43.2 | 41.1 | 42 | 45.8 | 33 | 33 |
| TiZrOx | 160 | 2 | 2 | 2 | 2 | 2 | 2 |
| $Si_3N_4$ | 144 | 33.2 | 31.1 | 32 | 35.8 | 26 | 27 |
| ZnO | 142 | 8 | 8 | 8 | 8 | 5 | 4 |
| Blocking layer NiCr | 130 | 1.3 | 1.1 | 0.8 | 1.2 | 1.2 | 1.2 |
| Functional layer Ag3 | 120 | 16.5 | 17.2 | 17.3 | 17.6 | 18.3 | 16.9 |
| Blocking layer NiCr | 110 | 0.5 | 0.5 | 0.5 | 0.5 | 0 | 0 |
| Dielectric coating M3 | 100 | 93.7 | 92.6 | 90.8 | 90.5 | 81 | 68.5 |
| ZnO | 108 | 8 | 8 | 8 | 8 | 12 | 13 |
| SnZnO | 106 | — | — | — | — | 10 | 11.5 |
| $Si_3N_4$ | 104 | 77.7 | 76.6 | 74.8 | 74.5 | 54 | 40 |
| ZnO | 102 | 8 | 8 | 8 | 8 | 5 | 4 |
| Blocking layer NiCr | 90 | 0.5 | 0.5 | 0.5 | 0.5 | 2 | 0.9 |
| Functional layer Ag2 | 80 | 16.5 | 17.1 | 16.8 | 16.7 | 13.8 | 12.4 |
| Blocking layer NiCr | 70 | 1.7 | 1.8 | 1.5 | 0.5 | 0 | 0 |
| Dielectric coating M2 | 60 | 71.3 | 71.5 | 70.7 | 69.8 | 72 | 66 |
| ZnO | 68 | 8 | 8 | 8 | 8 | 11 | 7 |
| $Si_3N_4$ | 64 | 55.3 | 55.5 | 54.7 | 53.8 | 57 | 56 |
| ZnO | 62 | 8 | 8 | 8 | 8 | 4 | 3 |
| Blocking layer NiCr | 50 | 0.5 | 0.5 | 1.3 | 2.2 | 1.8 | 0.8 |
| Functional layer Ag1 | 40 | 9.7 | 10.1 | 9.4 | 8.1 | 7.7 | 8.9 |
| Blocking layer NiCr | 30 | 0.7 | 0.5 | 0.5 | 0.5 | 0 | 0 |
| Dielectric coating M1 | 20 | 52.1 | 48.9 | 50.8 | 59.5 | 68 | 35 |
| ZnO | 28 | 8 | 8 | 8 | 8 | 9 | 7 |
| $Si_3N_4$ | 24 | 44.1 | 40.9 | 42.8 | 51.5 | 59 | 28 |
| Glass substrate (mm) | 10 | 6 | 6 | 6 | 6 | 6 | 6 |

Each dielectric coating 20, 60, 100 underneath a functional layer 40, 80, 120 comprises a final stabilizing layer 28, 68, 108 based on crystalline zinc oxide, and which is in contact with the functional layer 40, 80, 120 deposited immediately on top.

Each dielectric coating 60, 100, 140 on top of a functional layer 40, 80, 120 comprises a first stabilizing layer 62, 102, 142 based on crystalline zinc oxide, and which is in contact with the functional layer 40, 80, 120 deposited immediately on top.

Each functional metallic layer 40, 80, 120 is on top of a blocking layer 30, 70 and 110 (not represented in FIG. 1) and underneath and in contact with a blocking layer 50, 90 and 130.

The stack also comprises a protective layer made of titanium zirconium oxide 160 (not represented in FIG. 1).

Table 3 below summarizes the characteristics linked to the thicknesses of the functional layers and of the dielectric coatings.

TABLE 3

| | Inv. 1 | | Inv. 2 | | Inv. 3 | | Inv. 4 | | Comp. 1 | | Comp. 2 | |
|---|---|---|---|---|---|---|---|---|---|---|---|---|
| RD | Ep | Eo | Ep | Eo | Ep | Eo | Ep | Eo | Ep | Eo | Ep | Eo |
| M1 | 52.1 | 105.1 | 48.9 | 98.6 | 50.8 | 102.5 | 59.5 | 120.1 | 68 | 137.3 | 35 | 70.5 |
| M2 | 71.3 | 143.5 | 71.5 | 143.9 | 70.7 | 142.2 | 69.8 | 140.4 | 72 | 145.0 | 66 | 133.2 |
| M3 | 93.7 | 188.9 | 92.6 | 186.7 | 90.8 | 183.0 | 90.5 | 182.4 | 81 | 163.7 | 68.5 | 138.4 |
| M4 | 43.2 | 87.6 | 41.1 | 83.4 | 42 | 85.2 | 45.8 | 92.9 | 33 | 67.2 | 33 | 67.3 |
| Ag3/Ag2 | 1.00 | | 1.01 | | 1.03 | | 1.05 | | 1.33 | | 1.36 | |
| Ag2 > 15 nm | yes | | yes | | yes | | yes | | no | | no | |
| Σ Ep CB | 5.20 | | 4.90 | | 5.10 | | 5.40 | | 5.00 | | 2.90 | |

RD: dielectric coating; CB: blocking layer; Ep: physical thickness; Eo: optical thickness.

II. "Solar Control" and Colorimetry Performances

Table 4 lists the main optical characteristics measured when the glazings are part of double glazing having a 6/16/4 structure: 6 mm glass/16 mm interlayer space filled with 90% argon and 10% air/4 mm glass, the stack being positioned on face 2 (face 1 of the glazing being the outermost face of the glazing, as is customary).

For these double glazings:

$T_L$ indicates: the light transmission in the visible region in %, measured according to the illuminant D65 at 2° observer;

a*T and b*T indicate the a* and b* colors in transmission in the L*a*b* system measured according to the illuminant D65 at 2° observer and measured perpendicularly to the glazing;

$R_{Lext}$ indicates: the light reflection in the visible region in %, measured according to the illuminant D65 at 2° observer on the side of the outermost face, face 1;

a*$R_{ext}$ and b*$R_{ext}$ indicate the a* and b* colors in reflection in the L*a*b* system measured according to the illuminant D65 at 2° observer on the side of the outermost face and thus measured perpendicularly to the glazing, $R_{Lint}$ indicates: the light reflection in the visible region in %, measured according to the illuminant D65 at 2° observer on the side of the internal face, face 4;

a*$R_{int}$ and b*$R_{int}$ indicate the a* and b* colors in reflection in the L*a*b* system measured according to the illuminant D65 at 2° observer on the side of the internal face and thus measured perpendicularly to the glazing.

The colorimetric values at an angle a*g60° and b*g60° are measured on single glazing under an incidence of 60°. This takes into account the neutrality of the colors at an angle.

TABLE 4

|  | Target value | Inv. 1 | Inv. 2 | Inv. 3 | Inv. 4 | Comp. 1 | Comp. 2 |
|---|---|---|---|---|---|---|---|
| "g" % | ≤20% | 19 | 19 | 19 | 19 | 22 | 28 |
| "s" | >2.0 | 2.1 | 2.1 | 2.1 | 2.1 | 2.3 | 2.1 |
| $T_L$ % | ≈40% | 40 | 40 | 40 | 40 | 50 | 60 |
| a*T | <0 | −4.5 | −5.0 | −4.7 | −5.7 | −7.0 | −6.9 |
| b*T | — | −0.1 | 0.0 | −1.4 | 2.0 | .05 | 3.0 |
| $R_{Lext}$ % | <20% | 18 | 18 | 14 | 12 | 17 | 15 |
| a*$R_{ext}$ | <0 | −2.4 | −2.7 | −2.2 | −2.8 | −6.5 | −3.1 |
| b*$R_{ext}$ | <0 | −6.6 | −7.0 | −7.0 | −9.0 | −8.5 | −8.9 |
| $R_{Lint}$ % | — | 22 | 21 | 20 | 20 | 20 | 19 |
| a*$R_{int}$ | <0 | −11.0 | −13.0 | −13.0 | −13.2 | −8.0 | −3.8 |
| b*$R_{int}$ | <0 | −10.8 | −13.1 | −13.0 | −13.5 | −8.0 | −3.0 |
| a*g60° | — | −6.5 | −4.7 | −4.0 | −1.2 | −4.2 | −4.2 |
| b*g60° | — | −1.1 | −1.9 | −1.2 | −2.4 | −1.2 | −1.2 |

The examples according to the invention all have a pleasant and subdued color in transmission, preferably in the range of blues or blue-greens.

The glazings according to the invention have both a solar factor of less than or equal to 20% and a selectivity of greater than 2.0. These glazings additionally have an external reflection of at least less than 20%.

The solution proposed therefore makes it possible to have a solar factor of less than 20% while keeping a selectivity of greater than 2.0 and favorable esthetics.

Examples 3 and 4 according to the invention are particularly advantageous since they have, in addition to a low solar factor and a high selectivity, extremely low values of light reflection on the external side, in particular of less than 15%.

The invention claimed is:

1. A material comprising a transparent substrate coated with a stack of layers successively comprising, starting from the substrate, an alternation of three silver-based functional metallic layers referred to, starting from the substrate, as first, second and third functional layers and of four dielectric coatings, referred to, starting from the substrate, as a first dielectric coating M1, a second dielectric coating M2, a third dielectric coating M3 and a fourth dielectric coating M4, each dielectric coating comprising at least one dielectric layer, so that each functional metallic layer is positioned between two dielectric coatings, wherein:

the material has a light transmission of less than 50%, a thickness of the first functional layer is less than a thickness of the second functional layer, the thickness of the first functional layer is less than a thickness of the third functional layer, a ratio of the thickness of the third functional metallic layer to the thickness of the second functional layer is between 0.90 and 1.10, including these values, the thickness of the first functional metallic layer is between 6 and 12 nm, the thickness of the second functional metallic layer is between 15 and 20 nm, the thickness of the third functional metallic layer is between 15 and 20 nm, the first, second, third and fourth dielectric coatings M1, M2, M3 and M4 each have an optical thickness, respectively, Eo1, Eo2, Eo3 and Eo4 satisfying the following equation: Eo4<Eo1<Eo2<Eo3, an optical thickness Eo1 of the first dielectric coating M1 is greater than 80 nm, an optical thickness Eo2 of the second dielectric coating M2 is greater than 100 nm, an optical thickness Eo3 of the third dielectric coating M3 is greater than 120 nm, an optical thickness Eo4 of the fourth dielectric coating M4 is comprised between 70 and 120 nm.

2. The material as claimed in claim 1, wherein the thickness of the second functional layer is greater than 15 nm.

3. The material as claimed in claim 1, wherein the stack also comprises at least one blocking layer located in contact with one of the functional metallic layers, the at least one blocking layer being selected from the group consisting of metallic layers based on a metal or on a metal alloy, metal nitride layers, metal oxide layers and metal oxynitride layers of one or more elements selected from titanium, nickel, chromium and niobium.

4. The material as claimed in claim 3, wherein a total thickness of all the blocking layers in contact with the functional layers is between 4 and 7 nm, including these values.

5. The material as claimed in claim 3, wherein the at least one blocking layer is selected from the group consisting of Ti, TiN, TiOx, Nb, NbN, Ni, NiN, Cr, CrN, NiCr layer and NiCrN layer.

6. The material as claimed in claim 1, wherein the dielectric coatings satisfy the following characteristics:

the optical thickness of the first dielectric coating M1 is from 80 to 140 nm, the optical thickness of the second dielectric coating M2 is from 100 to 170 nm, the optical thickness of the third dielectric coating M3 is from 120 to 240 nm, the optical thickness of the fourth dielectric coating M4 is from 70 to 120 nm.

7. The material as claimed in claim 1, wherein each dielectric coating comprises at least one dielectric layer having a barrier function based on silicon and/or aluminum compounds selected from the group consisting of oxides, silicon nitrides $Si_3N_4$, AlN and oxynitrides $SiO_xN_y$ and $AlO_xN_y$.

8. The material as claimed in claim 7, wherein the at least one dielectric layer is $SiO_2$ or $Al_2O_3$.

9. The material as claimed in claim 1, wherein each dielectric coating comprises at least one dielectric layer having a stabilizing function based on a crystalline oxide.

10. The material as claimed in claim 9, wherein the crystalline oxide is zinc oxide, which is optionally doped with aluminum.

11. The material as claimed in claim 1, wherein each functional layer is on top of a dielectric coating, an upper layer of which is a dielectric layer having a stabilizing function, and/or underneath a dielectric coating, a lower layer of which is a dielectric layer having a stabilizing function.

12. The material as claimed in claim 11, wherein the upper layer and the lower layer are zinc oxide layers.

13. The material as claimed in claim 1, wherein the stack, defined starting from the transparent substrate, comprises:
the first dielectric coating M1 comprising at least one dielectric layer having a barrier function and one dielectric layer having a stabilizing function,
optionally a blocking layer,
the first functional layer,
optionally a blocking layer,
the second dielectric coating M2 comprising at least one lower dielectric layer having a stabilizing function, one dielectric layer having a barrier function and one upper dielectric layer having a stabilizing function,
optionally a blocking layer,
the second functional layer,
optionally a blocking layer,
the third dielectric coating M3 comprising at least one lower dielectric layer having a stabilizing function, one dielectric layer having a barrier function and one upper dielectric layer having a stabilizing function,
optionally a blocking layer,
the third functional layer,
optionally a blocking layer,
the fourth dielectric coating M4 comprising at least one dielectric layer having a stabilizing function, one dielectric layer having a barrier function and optionally one protective layer.

14. The material as claimed in claim 1, wherein the material has a light reflection on the external side of less than 20%.

15. A glazing comprising at least one material as claimed in claim 1.

16. The glazing as claimed in claim 15, wherein the stack is positioned in the glazing so that an incident light coming from outside passes through the first dielectric coating before passing through the first functional metallic layer.

17. The glazing as claimed in claim 15, wherein the glazing is in the form of monolithic, laminated or multiple glazing.

18. The glazing as claimed in claim 17, wherein the multiple glazing is a double glazing or triple glazing.

19. A process for obtaining a material as claimed in claim 1, comprising depositing the layers of the stack by magnetron sputtering.

* * * * *